(12) United States Patent
Taylor et al.

(10) Patent No.: US 11,634,440 B2
(45) Date of Patent: Apr. 25, 2023

(54) METHOD OF FORMING A CRYSTALLINE OR POLYCRYSTALLINE LAYER OF AN ORGANIC-INORGANIC METAL HALIDE PEROVSKITE

(71) Applicant: OXFORD PHOTOVOLTAICS LIMITED, Yarnton (GB)

(72) Inventors: Alice Elizabeth Taylor, Yarnton (GB); Laura Miranda Perez, Yarnton (GB)

(73) Assignee: OXFORD PHOTOVOLTAICS LIMITED, Yarnton (GB)

( * ) Notice: Subject to any disclaimer, the term of this patent is extended or adjusted under 35 U.S.C. 154(b) by 0 days.

(21) Appl. No.: 17/279,146

(22) PCT Filed: Sep. 23, 2019

(86) PCT No.: PCT/GB2019/052669
§ 371 (c)(1),
(2) Date: Mar. 24, 2021

(87) PCT Pub. No.: WO2020/065282
PCT Pub. Date: Apr. 2, 2020

(65) Prior Publication Data
US 2021/0395279 A1 Dec. 23, 2021

(30) Foreign Application Priority Data
Sep. 24, 2018 (GB) ...................... 1815547

(51) Int. Cl.
| | | |
|---|---|---|
| *C07F 7/24* | (2006.01) | |
| *B05D 1/00* | (2006.01) | |
| *C23C 14/00* | (2006.01) | |
| *C23C 14/06* | (2006.01) | |
| *C23C 14/58* | (2006.01) | |
| *H01L 51/00* | (2006.01) | |

(52) U.S. Cl.
CPC ............. *C07F 7/24* (2013.01); *B05D 1/005* (2013.01); *C23C 14/0021* (2013.01); *C23C 14/0694* (2013.01); *C23C 14/58* (2013.01); *H01L 51/001* (2013.01); *H01L 51/0003* (2013.01); *B05D 2401/10* (2013.01); *H01L 2251/30* (2013.01)

(58) Field of Classification Search
CPC ...... C07F 7/24; C07F 7/22; C07F 9/94; C07F 7/30; C07F 1/08; H01L 21/02197; H01L 45/147; H01L 28/55; Y10S 502/525; C04B 35/4682; C04B 35/4686; C04B 2235/768; C25B 11/0773; C01P 2002/34; B01J 23/002; G11C 2213/31
See application file for complete search history.

(56) References Cited

U.S. PATENT DOCUMENTS

| | | | |
|---|---|---|---|
| 5,871,579 A | 2/1999 | Liang et al. | |
| 10,622,409 B2 * | 4/2020 | Kamino | H01L 27/302 |
| 2016/0049585 A1 | 2/2016 | Lin et al. | |
| 2016/0268510 A1 * | 9/2016 | Moon | C07F 13/00 |
| 2017/0243699 A1 * | 8/2017 | Beaumont | H01L 31/032 |
| 2018/0066383 A1 * | 3/2018 | Bakr | C30B 29/12 |
| 2018/0194786 A1 * | 7/2018 | Choi | H01L 31/18 |
| 2018/0247769 A1 | 8/2018 | Qi et al. | |
| 2018/0351019 A1 * | 12/2018 | Zhu | H01L 51/0003 |
| 2018/0351123 A1 * | 12/2018 | Saliba | H01L 51/447 |
| 2019/0185495 A1 * | 6/2019 | Cahen | C07F 7/2288 |
| 2019/0241802 A1 * | 8/2019 | Wheeler | C07F 7/24 |
| 2020/0239499 A1 * | 7/2020 | Zhu | H01L 51/0077 |
| 2020/0377532 A1 * | 12/2020 | Li | C07F 7/24 |

FOREIGN PATENT DOCUMENTS

| | | | |
|---|---|---|---|
| CN | 104250723 A | * | 12/2014 |
| CN | 107887510 | | 4/2018 |
| CN | 108539025 | | 9/2018 |

(Continued)

OTHER PUBLICATIONS

Y. Zhao et al., The Journal of Physical Chemistry Letters, 4175-4186 (2014) (Year: 2014).*

(Continued)

*Primary Examiner* — Alexander R Pagano
(74) *Attorney, Agent, or Firm* — Meunier Carlin & Curfman LLC

(57) ABSTRACT

The present invention provides a method of forming a crystalline or polycrystalline layer of an organic-inorganic metal halide perovskite material comprising a three-dimensional crystal structure represented by the formula $AMX_3$, in which A represents an organic cation or a mixture of two or more different cations, at least one of which is an organic cation, M represents a divalent metal cation or a mixture of two or more different divalent metal cations, and X represents halide anions which are the same or different, the method comprising the steps of: (i) forming a first layer on the surface of a substrate, the first layer comprising an organic-inorganic metal halide perovskite material having a planar, layered two-dimensional crystal structure (ii) reacting the first layer with one or more organic halides to form the crystalline or polycrystalline layer comprising an organic-inorganic metal halide perovskite material having the formula $AMX_3$. Also provided is an optoelectronic or photovoltaic device including an active layer comprising an organic-inorganic metal halide perovskite material comprising a three-dimensional crystal structure represented by the formula $AMX_3$, wherein the material is obtainable using the above defined method.

19 Claims, 15 Drawing Sheets

(56) References Cited

FOREIGN PATENT DOCUMENTS

| WO | 2015/184197 | | 12/2015 | |
|---|---|---|---|---|
| WO | WO-2016131376 | A1 * | 8/2016 | ............. C23C 22/02 |
| WO | 2016/194317 | | 12/2016 | |
| WO | WO-2016198889 | A1 * | 12/2016 | ........... C07C 257/12 |
| WO | 2017066160 | A1 | 4/2017 | |

OTHER PUBLICATIONS

T. Singh et al., Advanced Energy Materials, (Sep. 14, 2017) (Year: 2017).*
D. McMeekin et al., 351 Science, 151-155 (2016) (Year: 2016).*
W. Yang et al., 348 Science, 1234-1237 (2015) (Year: 2015).*
W. Li et al., 2 Nature Reviews Materials (Feb. 7, 2017) (Year: 2017).*
H. Harms et al., 176 Faraday Discuss., 251-269 (2014) (Year: 2014).*
M. Filip et al., 115 PNAS, 5397-5402 (2018) (Year: 2018).*
J. Attfield et al., 44 Dalton Transactions, 10541-10542 (2014) (Year: 2014).*
International Search Report and Written Opinion dated Dec. 3, 2019, from International Application No. PCT/GB2019/052669, 15 pages.
Nelson J.—"The Physics of Solar Cells", pp. 297-309, Imperial College Press, 2003, ISBN-13 978-1-86094-340-9.
Reinders A. et al—"Photovoltaic Solar Energy"—from Fundamentals to Applications, 2017, Wiley ISBN 9781118927465, especially Chapter 6.3.
Yu Zhang et al—"From 2D to 3D: a facile and effective procedure for fabrication of planar CH3NH3PbI3 perovskite solar cells", Journal of Materials Chemistry A, vol. 6, No. 37, Aug. 30, 2018 (Aug. 30, 2018), pp. 17867-17873, XP055645579.
Ge Li et al—"Ion-Exchange-Induced 2D-3D Conversion of HMA 1-x FA x Pbl 3 CI Perovskite into a High-Quality MA 1-x Fa x Pbl 3 Perovskite"; Angewandte Chemie, International Edition, vol. 55, No. 43, Sep. 26, 2016 (Sep. 26, 2016), pp. 13460-13464, XP055354292.
Weixin Huang et al—"In Situ Identification of Cation-Exchange-Induced Reversible Transformations of 3D and 2D Perovskites"; Chemical Communications, vol. 54, No. 46, May 16, 2018 (May 16, 2018), pp. 5879-5882, XP055645563.
Weixin Huang et al—"Controllable Transformation Between 3D and 2D Perovskites Through Cation Exchange"; Chemical Communications, vol. 54, No. 57, Jun. 20, 2018 (Jun. 20, 2018), pp. 7944-7947, XP055645564.
Combined Search and Examination Report under Sections 17 and 18(3) dated Mar. 15, 2019, from Application No. GB1815547.3, 6 pages.
Shannon et al., "Revised Effective Ionic Radii and Systematic Studies of Interatomic Distances in Halides and Chalcogenides", Acta Cryst. A32 751-767 (1976).
Richard J.D. Tilley, Perovskites: Structure-Property Relationships, Chapter 1—The ABX3 Perovskite Structure, Mar. 11, 2016 (41 pages).
Office Action received in corresponding Indian Patent Application No. 202117018523, dated Oct. 17, 2022, 5 pages.

* cited by examiner (a) RMS = 6.4 nm  (b) RMS = 27.7 nm

METHOD OF FORMING A CRYSTALLINE OR POLYCRYSTALLINE LAYER OF AN ORGANIC-INORGANIC METAL HALIDE PEROVSKITE

FIELD OF THE INVENTION

The present invention relates to methods of making layers of three-dimensional perovskite materials having an improved crystallinity. The crystalline perovskite materials of the present invention can show improved morphology and improved optoelectronic properties. The present invention further relates to optoelectronic devices and solar cells which contain layers of perovskite materials made using the methods.

BACKGROUND OF THE INVENTION

Solar energy conversion is one of the most promising technologies to provide renewable energy. However, the high cost of manufacturing devices that capture solar energy, including high material costs, has historically hindered its widespread use.

The efficiency of a material which is used in a photovoltaic device, such as a solar cell, under normal daylight conditions is a function of the band gap for that material. If the band gap is too high, most daylight photons cannot be absorbed and are lost to transmission or reflection; if it is too low, then most photons have much more energy than necessary to excite electrons across the band gap, and the rest will be lost to thermalisation. The Shockley-Queisser limit refers to the theoretical maximum efficiency that can be obtained with a single junction solar cell. The highest theoretical efficiency is about 33% and is obtained with a 1.34 eV band gap.

It is possible to get even higher theoretical efficiencies using tandem or multijunction cells in series with different band gaps (see for example J.Nelson "The Physics of Solar Cells" pp 297-309, Imperial College Press [2003] ISBN-13 978-1-86094-340-9).

One particularly promising class of materials for the manufacture of solar cells is metal halide perovskites (see "Photovoltaic Solar Energy—from Fundamentals to Applications" [2017], edited by A Reinders et al. Wiley ISBN 9781118927465, especially chapter 6.3). 3-dimensional (3D) perovskite materials have general formula $AMX_3$ where A and M are cations and X is an anion. Their structure is formed by a 3D network of $MX_6$ that can be linked through the corners, edges or faces, with the A cations located in the dodecahedral sites between the $MX_6$ octahedra (12-fold environment). An example of a 3D perovskite with the $MX_6$ octahedra linked by corners is illustrated in FIG. 1. The relative sizes of A, M and X determine the stability of perovskites, as well as the specific crystal structure symmetry that forms. Perovskites more generally may be considered to be crystal structures containing sections with the 3D perovskite structure.

Hybrid organo-metal halide perovskites (HOPs) are a sub-family of the perovskite group, where A is an organic cation or a mixture of organic and inorganic cations, M is a metal, normally Pb, Sn, Ge, Cu, Bi or a mixture of them, and X is a halide, normally Cl, Br, I or a mixture of them. Recently, thin film HOPs have been discovered to be very good materials for optoelectronic applications, particularly as photovoltaic materials due to their unique ability to act both as a light harvesting medium and as a charge carrier transporter.

To date, HOP materials which adopt a single-phase 3D structure with corner-linked $BX_6$ octahedra have shown the highest performance in single-junction photovoltaic devices, with a 22.7% conversion efficiency being recorded in 2017. The first HOP found to be a good absorber for solar cells, $CH_3NH_3PbI_3$ ($MAPbI_3$), was limited for commercialisation due to stability issues. However, since then alternative compositions have been developed with increased stability and high performance, such as $(CH(NH_2)_2)_{1-x}Cs_xPbI_3$ ($FA_{1-x}Cs_xPbI_3$) and $(FA, MA, Cs, Rb)_1PbI_3$.

WO2016/194317 discloses a method of forming a perovskite film by inducing a chemical reaction between a metal halide compound and methylamine gas. The method includes forming a metal halide film on a substrate which is then exposed to methylamine gas to induce reaction to form a perovskite, which can be further treated by exposure to gaseous hydroiodic acid and gaseous methylamine in concert or consecutively.

CN108539025 discloses a highly-oriented two-dimensional hybrid perovskite thin film and the preparation method thereof. The perovskite thin film is a two-dimensional sheet thin film with high orientation and a thickness of 400-450 nm and is prepared by taking a two-dimensional stannic oxide nano sheet with high crystallinity, generated from conductive glass submerged in stannic chloride, and depositing thereon a perovskite thin film.

US2018/0247769 discloses a method of forming a lead-free perovskite film based on vacuum evaporation, comprising depositing a first Sn halide material on a substrate to form a first layer and then depositing a second organic halide material to form a second layer upon the first layer to obtain a sequentially-deposited two-layer film on the substrate. This is then annealed to induce inter-diffusion of the layers and to form the intended perovskite film.

US2016/0049585 discloses a method of fabricating a perovskite solar cell wherein a hole transport layer is formed on a transparent electrically conducting substrate, on which a perovskite layer is formed by a two-stage vacuum evaporation process. Thereafter an electron transport layer and an electrode layer are formed in order. The two-stage vacuum evaporation includes vacuum evaporating a first material on the hole transport layer and then vacuum evaporating a second material to react the first material with the second material in situ to form the perovskite layer.

The quality of the perovskite thin film is of critical importance to the performance of devices and is highly influenced by the method of fabrication of the film. Common routes for fabrication of 3D HOP thin films for optoelectronic applications fall into two general categories: so-called 1-step or 2-step processes. A 1-step process involves one material deposition stage to directly form a 3D perovskite on a substrate. A 2-step process involves one material deposition stage to form a precursor metal-halide such as $PbI_2$ or metal-halide-organic complex (such as $PbI_2$-dimethylsulphoxide or $PbI_2$-thiourea) film on a substrate, followed by a second material deposition stage and conversion of that precursor layer to a perovskite layer having a three dimensional crystal structure. Each of these processes can be achieved utilizing chemical deposition from solution or physical or chemical vapour deposition, or a combination of the two for the 2-step process. Both processes can involve additives, use different atmospheres and use heating steps to optimise the final perovskite film. The highest previously reported efficiencies come from a 2-step process.

The purpose of the present invention, therefore, is to provide a novel process for the preparation of 3D HOP thin films. The process produces films of higher quality with, for example, increased crystallinity, improved morphology, higher density, larger grain sizes, and long carrier lifetimes.

SUMMARY OF THE INVENTION

According to a first aspect of the present invention there is provided a method of forming a crystalline or polycrystalline layer of an organic-inorganic metal halide perovskite material comprising a three-dimensional crystal structure represented by the formula $AMX_3$, as specified in any of claims 1 to 19.

According to a second aspect of the invention there is provided an optoelectronic or photovoltaic device including an active layer comprising an organic-inorganic metal halide perovskite material comprising a three-dimensional crystal structure represented by the formula $AMX_3$, in which A represents an organic cation or a mixture of two or more different cations, at least one of which is an organic cation, M represents a divalent metal cation or a mixture of two or more different divalent metal cations, and X represents halide anions which are the same or different, wherein the material is obtainable by the method according to the first aspect of the invention.

The method utilizes an alternative precursor film to the metal-halide or metal-halide organic complex of the 2-step process that can be converted to a final 3D perovskite. The new precursor is a planar layered perovskite material having a two dimensional (2D) crystal structure, which we define below. This type of 2D hybrid organo-metal halide perovskite film is converted to an exceptionally high quality organo-metal halide perovskite film having a three dimensional (3D) crystal structure using the method of the present invention.

The 2D perovskites are a family of perovskites, in which layers of 3D perovskite are separated by interlayers, several examples are illustrated in FIG. 3. For the 2D HOPs the interlayers consist of organic blocks, where the organic blocks may contain some inorganic ion components or substitutions. The 2D HOPs of interest are ones in which the perovskite layers have corner-linked $MX_6$ octahedra, structurally similar to the 3D HOP films which currently show the highest performance in solar cells.

In a preferred embodiment, the planar layers of the 2D perovskite are oriented perpendicular to the normal of the surface of the substrate onto which the planar layers are deposited.

The perovskite layers in a 2D perovskite can have differing numbers of $AMX_3$ slabs (n), as illustrated in FIG. 4, and/or different orientations of the axis along which the layers are separated, as illustrated in FIG. 3. Depending on the chemical and physical nature of the interlayer organic block and its relative position between the perovskite ($AMX_3$) layers, it is possible to achieve a number of distinct structural forms of 2D perovskite material, for example:

a). "Ruddelsden-Popper perovskites" (RP), FIG. 3a, a family of materials with general formula $A'_2A_{n-1}M_nX_{3n+1}$ in which A is the cation in a 12-fold environment within the perovskite sheet, A' is the cation separating the 2D layers (the interlayer cation), M is the cation in a 6-fold position within the perovskite layer and X is the anion in the 9-fold position in the perovskite layers. A and A' can be the same or different cations, also A can be a unique cation or a mixture, A' can be a unique cation or a mixture, X can be a unique anion or a mixture and M can be a unique cation or a mixture. FIG. 4 shows the n=1, n=2 and n=3 members of the Ruddelsden-Popper family, where n is an integer which defines the number of AMX slabs in each 2D perovskite layer.

b). "Aurivillius perovskites", FIG. 3b, with general formula $A'_2A_{n-1}M_nX_{3n+3}$ where the organic interlayer block has the formula $A'_2X_2$. A, M and X are defined as above, A' can be a unique cation or a mixture but cannot be the same as A.

c). "Dion-Jacobson perovskites", FIG. 3c, with general formula $A'A_{n-1}M_nX_{3n+1}$, in which the organic block is formed by an organic molecule A' which is different than A.

For these first three examples the perovskite layers (for given n) remain identical to each other, as illustrated in FIG. 3, with the perovskite layers parallel to the {100} crystallographic direction.

A fourth family "{110} parallel perovskites", FIG. 4d, with general formula $A'_2A_nM_nX_{3n+2}$ is also illustrated, in which the perovskite layers are parallel to the {110} crystallographic direction rather than the {100} crystallographic direction, and the organic interlayer is formed of A' cations defined in the same way as for Ruddlesden Popper perovskites.

The above examples of 2-D perovskites do not comprise an exhaustive list—other families exist and can be used in the present method—for example interlayers in the {110} parallel which look like the Aurivillius or D-J interlayers, or having different crystallographic directions for the stacking.

The aim of the present invention is to provide organic-inorganic metal halide perovskite materials with excellent three dimensional crystallinity, improved morphology, improved optoelectronic properties and excellent photovoltaic performance. The improved perovskite material made by the process of the present invention exhibits improved crystallinity, reduced (and preferably no) grain boundaries, is smooth in texture, large in grain size, and has a generally flat surface compared with other reported 3-D perovskite crystals. The present invention also provides improved crystalline 3-D perovskite materials which have a potentially higher stability than 3-D perovskite materials made using existing methods. As a result, these materials can be used to produce photovoltaic devices with improved properties.

BRIEF DESCRIPTION OF THE DRAWINGS

The present invention will now be more particularly described, by way of example only, with reference to the accompanying drawings, in which.

DETAILED DESCRIPTION OF THE INVENTION

Definitions

The term "photoactive", as used herein, refers to a region, layer or material that is capable of responding to light photoelectrically. A photoactive region, layer or material is therefore capable of absorbing the energy carried by photons in light that then results in the generation of electricity (e.g. by generating either electron-hole pairs or excitons).

The term "perovskite", as used herein, refers to a material with a three-dimensional crystal structure related to that of $CaTiO_3$ or a two-dimensional material comprising a layer of material, which layer has a structure related to that of $CaTiO_3$. The structure of $CaTiO_3$ can be represented by the formula $AMX_3$, wherein A and M are cations of different sizes and X is an anion. In the unit cell, the A cations are at (0,0,0), the M cations are at (1/2, 1/2, 1/2) and the X anions are at (1/2, 1/2, 0). The A cation is usually larger than the M cation. The skilled person will appreciate that when A, M and X are varied, the different ion sizes may cause the structure of the perovskite material to distort away from the structure adopted by $CaTiO_3$ to a lower-symmetry distorted structure. The symmetry will also be lower if the material is in the form of a layer that has a structure related to that of bulk $CaTiO_3$. Materials comprising a layer of perovskite material are well known. For instance, the $K_2NiF_4$ perovskites adopt the n=1 RP structure (as defined in the introduction). The skilled person will appreciate that a perovskite material can be represented by the formula $[A][M][X]_3$, wherein [A] is at least one cation, [M] is at least one cation and [X] is at least one anion. When the perovskite comprises more than one A cation, the different A cations may be distributed over the A sites in an ordered or disordered way. When the perovskite comprises more than one M cation, the different M cations may be distributed over the M sites in an ordered or disordered way. When the perovskite comprises more than one X anion, the different X anions may be distributed over the X sites in an ordered or disordered way.

Figure 1:
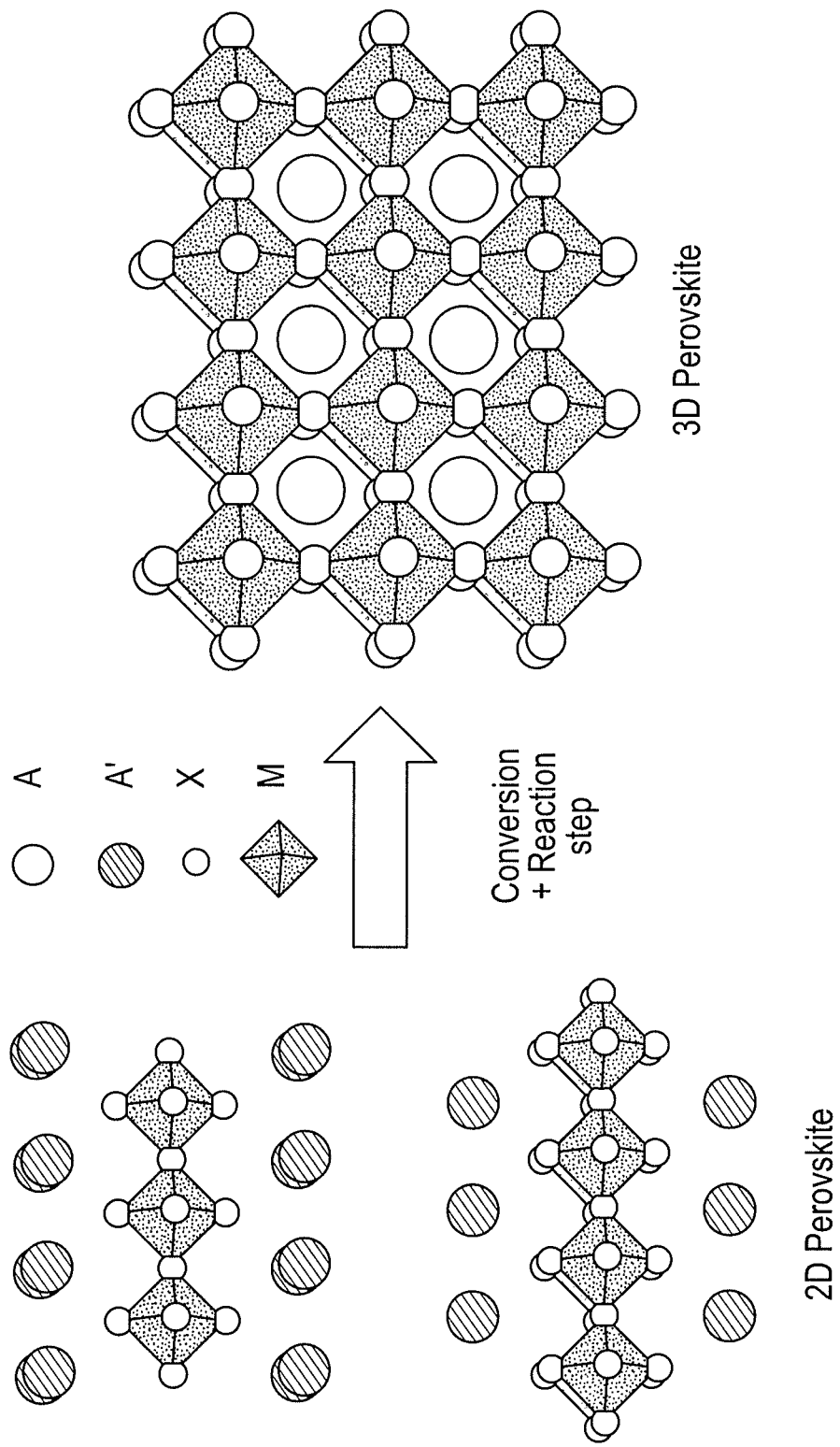
FIG. 1 shows conversion of a 2D perovskite structure to a 3D perovskite structure having $MX_6$ corner octahedra.
Figure 3:
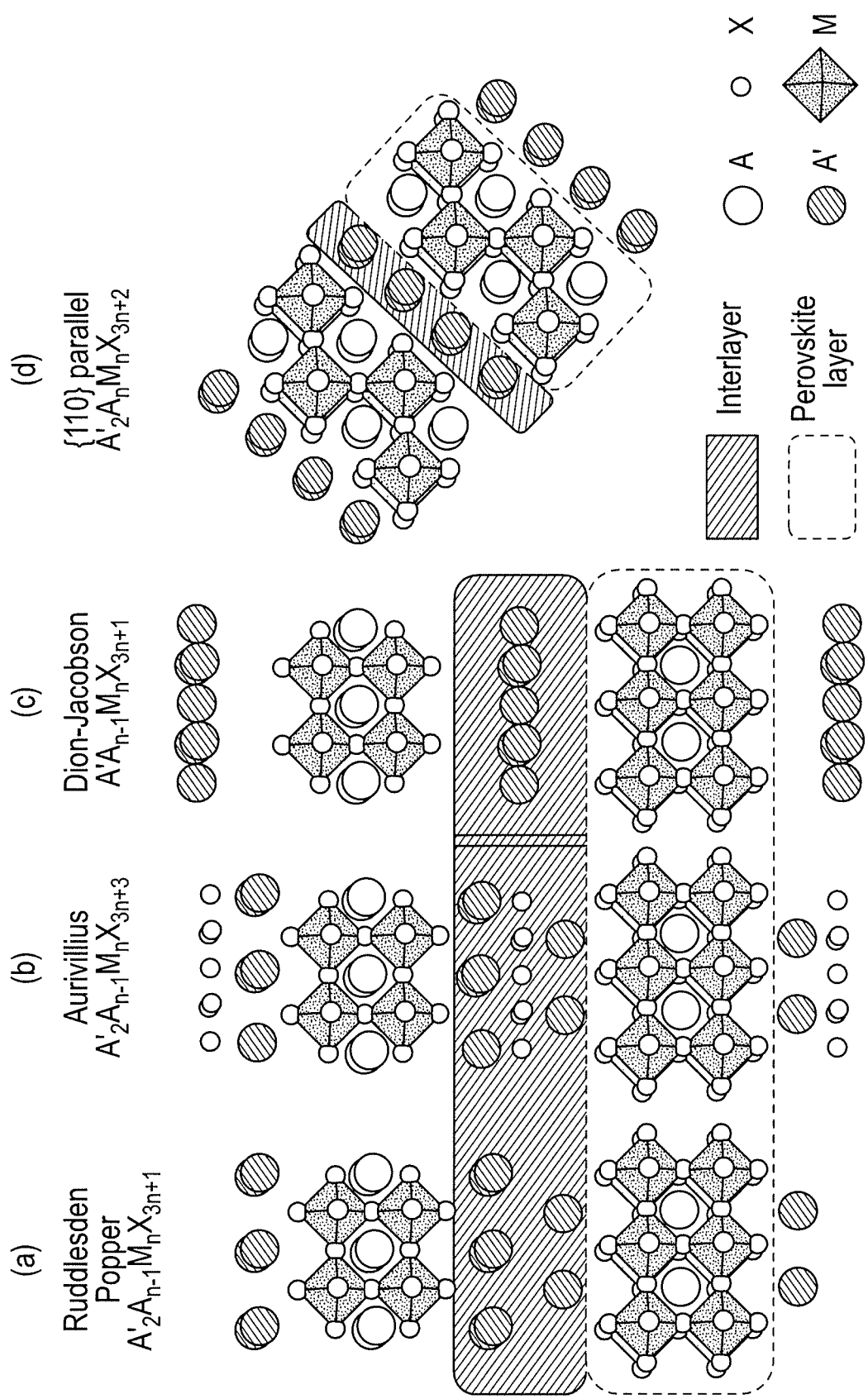
FIG. 3a-d illustrates n=2 Ruddlesden Popper, Aurivillius, Dion-Jacobson, and {110} parallel type 2D perovskites.

As mentioned in the preceding paragraph, the term "perovskite", as used herein, refers to (a) a material with a three-dimensional crystal structure related to that of $CaTiO_3$ or (b) a material comprising a layer of material, wherein the layer has a structure related to that of $CaTiO_3$. Although both of these categories of perovskite may be used in the devices, it is preferable in some circumstances to use a perovskite of the first category, (a), i.e. a perovskite having a three-dimensional (3D) crystal structure. Both types of perovskites have been described in detail in the introduction (FIGS. 1, 3 and 4). 2D layered perovskites tend to have high exciton binding energies, which favours the generation of bound electron-hole pairs (excitons), rather than free charge carriers, under photoexcitation. The bound electron-hole pairs may not be sufficiently mobile to reach the p-type or n-type contact where they can then transfer (ionise) and generate free charge. Consequently, in order to generate free charge, the exciton binding energy has to be overcome, which represents an energetic cost to the charge generation process and results in a lower voltage in a photovoltaic cell and a lower efficiency. In contrast, perovskites having a 3D crystal structure tend to have much lower exciton binding energies (on the order of thermal energy) and can therefore generate free carriers directly following photoexcitation. Accordingly, the perovskite semiconductor employed in the devices and processes of the invention is preferably a perovskite of the first category, (a), i.e. a perovskite which has a three-dimensional crystal structure, particularly when the optoelectronic device is a photovoltaic device such as a solar cell.

The 3D perovskite material produced using the method of this invention has general formula (I):

$$[A][M][X]_3 \qquad (I)$$

wherein [A] is an organic cation or a mixture of two or more different cations, at least one of which is an organic cation; [M] is a divalent metal cation or a mixture of two or more different divalent metal cations; and [X] is one or more halide anions.

[X] preferably comprises one or more halide anions selected from fluoride, chloride, bromide, and iodide, and preferably selected from chloride, bromide and iodide. More preferably [X] comprises one or more halide anions selected from bromide and iodide. In some examples, [X] preferably comprises two different halide anions selected from fluoride, chloride, bromide, and iodide, and preferably selected from chloride, bromide and iodide, and more preferably comprises bromide and iodide.

Preferably, [A] is selected from one or more monovalent cations. [A] preferably comprises one or more organic cations selected from methylammonium ($CH_3NH_3^+$), formamidinium ($HC(NH_2)_2^+$), and ethyl ammonium ($CH_3CH_2NH_3^+$), and preferably comprises one organic cation selected from methylammonium ($CH_3NH_3^+$) and formamidinium ($HC(NH_2)_2^+$). [A] may comprise one or more inorganic cations selected from $Cs^+$, $Rb^+$, $Cu^+$, $Pd^+$, $Pt^+$, $Ag^+$, $Au^+$, $Rh^+$, and $Ru^+$.

[M] preferably comprises at least one divalent inorganic cation selected from $Pb^{2+}$ and $Sn^{2+}$, and preferably comprises $Pb^{2+}$.

In preferred examples, the perovskite material has the general formula:

$$A_xA'_{1-x}M(X_yX'_{1-y})_3 \quad \text{(IA)}$$

wherein A is formamidinium (FA), A' is a caesium cation ($Cs^+$), M is $Pb^{2+}$, X is iodide and X' is bromide, and wherein $0<x\leq1$ and $0<y\leq1$. In these preferred embodiments, the perovskite material can therefore comprise a mixture of two monovalent cations. In addition, in the preferred embodiments, the perovskite material can therefore comprise either a single iodide anion or a mixture of iodide and bromide anions. The present inventors have found such perovskite materials can have band gaps in from 1.50 eV to 1.75 eV and that layers of such perovskite materials can be readily formed with suitable crystalline morphologies and phases. More preferably, the perovskite material is $FA_{1-x}Cs_xPbI_{3-y}Br_y$.

The perovskite material employed in the present invention is one which is capable of absorbing light and thereby generating free charge carriers. Thus, the perovskite employed is a light-absorbing perovskite material. However, the skilled person will appreciate that the perovskite material could also be a perovskite material that is capable of emitting light, by accepting charge, both electrons and holes, which subsequently recombine and emit light. Thus, the perovskite employed may be a light-emitting perovskite for use in light emitting devices.

The perovskite material produced in this invention is crystalline or polycrystalline, e.g. comprised of more than one crystal.

As the skilled person will appreciate, the perovskite material employed in the present invention may be a perovskite which acts as an n-type, electron-transporting semiconductor when photo-doped. Alternatively, it may be a perovskite which acts as a p-type hole-transporting semiconductor when photo-doped. Thus, the perovskite may be n-type or p-type, or it may be a nominally intrinsic semiconductor. In preferred embodiments, the perovskite employed is one which acts as an n-type, electron-transporting semiconductor when photo-doped. The perovskite material may exhibit ambipolar charge transport, and therefore act as both n-type and p-type semiconductor. In particular, the perovskite may act as both n-type and p-type semiconductor depending upon the type of junction formed between the perovskite and an adjacent material.

Typically, the perovskite semiconductor used in the present invention is a photosensitizing material, i.e. a material which is capable of performing both photogeneration and charge transportation.

The term "mixed-anion", as used herein, refers to a compound comprising at least two different anions. The term "halide" refers to an anion of an element selected from Group 17 of the Periodic Table of the Elements, i.e., of a halogen. Typically, halide anion refers to a fluoride anion, a chloride anion, a bromide anion, an iodide anion or an astatide anion. Perovskite compounds defined herein may have more than one halide anion. Suitable combinations of halide anions include Br/I.

The term "metal halide perovskite", as used herein, refers to a perovskite, the formula of which contains at least one metal cation and at least one halide anion. The term "organometal halide perovskite", as used herein, refers to a metal halide perovskite, the formula of which contains at least one organic cation.

The term "organic cation" refers to a cation comprising carbon. The cation may comprise further elements, for example, the cation may comprise hydrogen, nitrogen or oxygen. The term "inorganic cation" refers to a cation that is not an organic cation. By default, the term "inorganic cation" refers to a cation that does not contain carbon.

The term "n-type", as used herein, refers to a region, layer or material that comprises an extrinsic semiconductor with a larger concentration of electrons than holes. In n-type semiconductors, electrons are therefore majority carriers and holes are the minority carriers, and they are therefore electron transporting materials. The term "n-type region", as used herein, therefore refers to a region of one or more electron transporting (i.e. n-type) materials. Similarly, the term "n-type layer" refers to a layer of an electron-transporting (i.e. an n-type) material. An electron-transporting (i.e. an n-type) material could be a single electron-transporting compound or elemental material, or a mixture of two or more electron-transporting compounds or elemental materials. An electron-transporting compound or elemental material may be undoped or doped with one or more dopant elements or compounds.

The term "p-type", as used herein, refers to a region, layer or material that comprises an extrinsic semiconductor with a larger concentration of holes than electrons. In p-type semiconductors, holes are the majority carriers and electrons are the minority carriers, and they are therefore hole transporting materials. The term "p-type region", as used herein, therefore refers to a region of one or more hole transporting (i.e. p-type) materials. Similarly, the term "p-type layer" refers to a layer of a hole-transporting (i.e. a p-type) material. A hole-transporting (i.e. a p-type) material could be a single hole-transporting compound or elemental material, or a mixture of two or more hole-transporting compounds or elemental materials. A hole-transporting compound or elemental material may be undoped or doped with one or more dopant elements or compounds.

The term "layer", as used herein, refers to any structure which is substantially laminar in form (for instance extending substantially in two perpendicular directions, but limited in its extension in the third perpendicular direction). A layer may have a thickness which varies over the extent of the layer. Typically, a layer has approximately constant thickness. The "thickness" of a layer, as used herein, refers to the average thickness of a layer. The thickness of layers may easily be measured, for instance by using microscopy, such as electron microscopy of a cross section of a film, or by surface profilometry for instance using a stylus profilometer.

Reaction Process

The present invention relates to a process for making a 3D organic-inorganic hybrid halide perovskite material which process involves the conversion of a 2D organic-inorganic hybrid halide perovskite material to the desired 3D perovskite material. Preferably, the 3D perovskite is a highly crystalline material. Further preferably, the resulting 3D perovskite material is suitable for use as a high-quality photovoltaic absorber material.

Figure 2A:
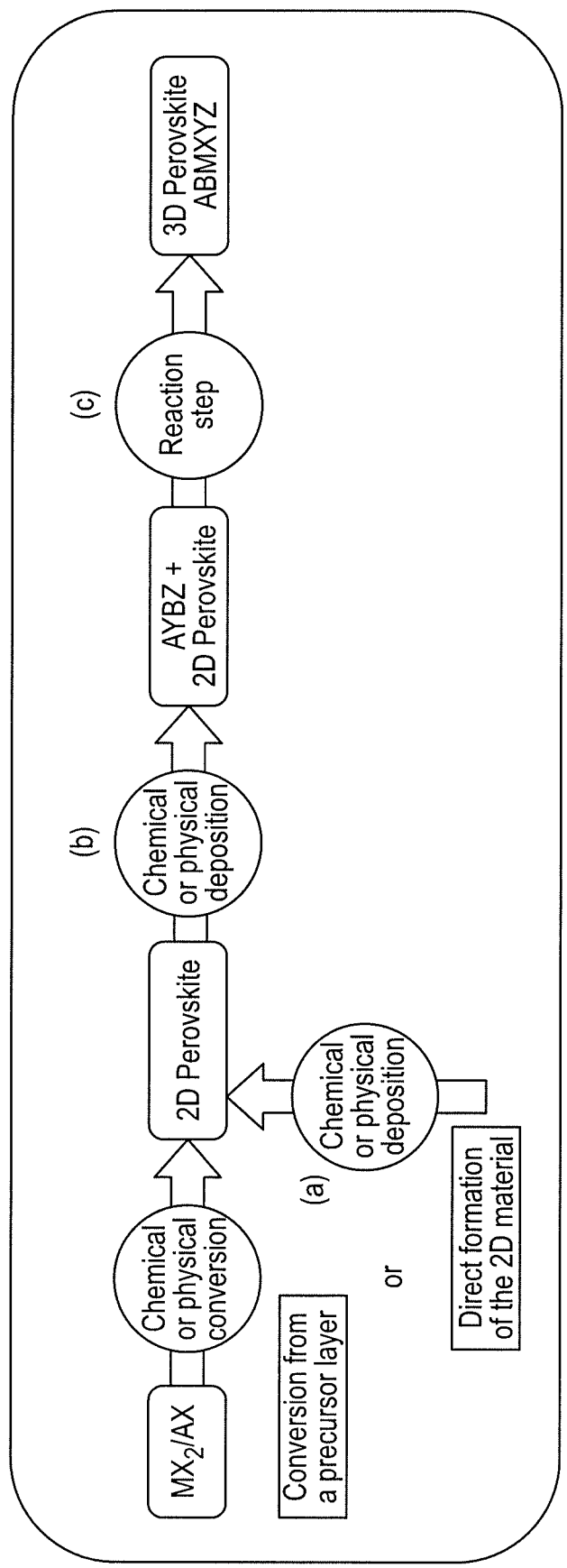
FIG. 2A illustrates a schematic representation of the process flow of the present invention.
Figure 14:
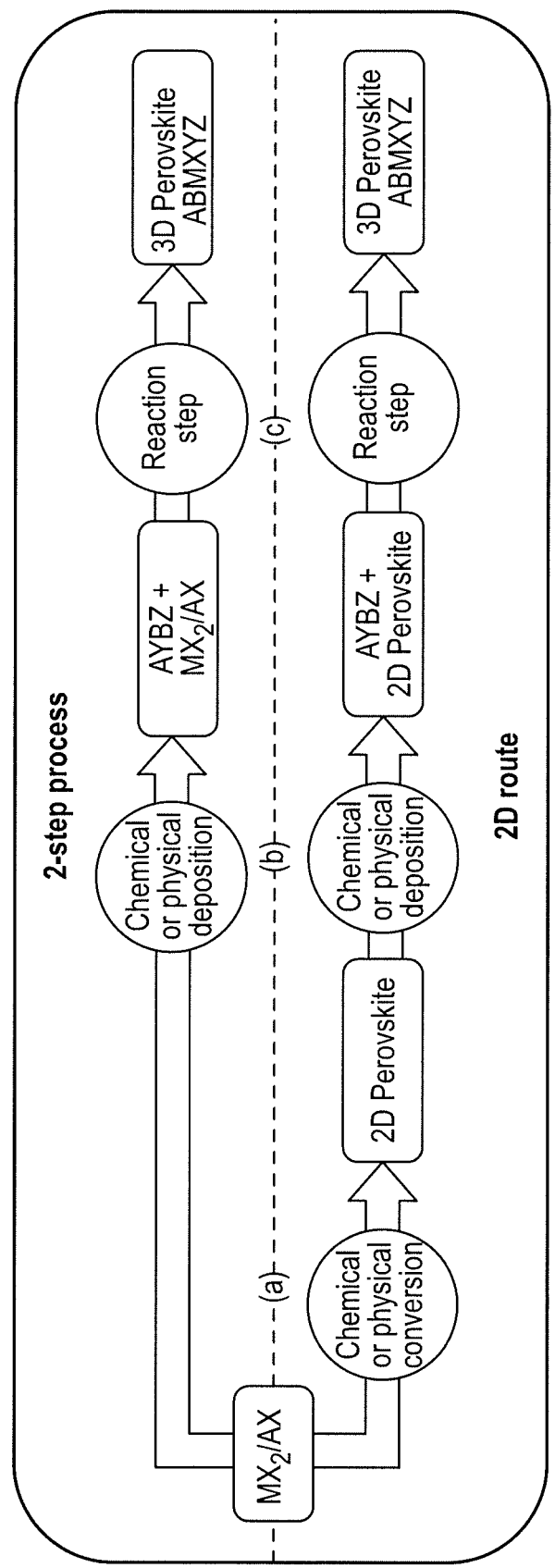
FIG. 14 illustrates schematic representation of the overall process flow for a method using the process of the present invention, and the overall process flow for a 2-step prior art process.

FIG. 2 shows a schematic representation of several possible process flows of the method according to the present invention, and FIG. 14 illustrates one of these process flows for the overall reaction process of the present invention and compares it to the prior art route. The process of the present invention involves forming a layer of a 2D perovskite material onto a substrate and subjecting this 2D perovskite material layer to a reaction step to convert the 2D perovskite material to a 3D perovskite analogue.

In its broadest aspect the present invention provides a method of forming a crystalline or polycrystalline layer of an organic-inorganic metal halide perovskite material comprising a three-dimensional crystal structure represented by the formula $AMX_3$, in which A represents an organic cation or a mixture of two or more different cations, at least one of which is an organic cation, M represents a divalent metal cation or a mixture of two or more different divalent metal cations, and X represents halide anions which are the same or different, the method comprising the steps of:
(i) forming a first layer on the surface of a substrate, the first layer comprising an organic-inorganic metal halide perovskite material having a planar, layered two-dimensional crystal structure
(ii) reacting the first layer with one or more organic halides to form the crystalline or polycrystalline layer comprising an organic-inorganic metal halide perovskite material having the formula $AMX_3$.

There are various ways of forming the first layer comprising an organic-inorganic metal halide perovskite material having a planar, layered two-dimensional crystal structure. In one aspect, the present invention provides a method of forming a crystalline or polycrystalline layer of an organic-inorganic metal halide perovskite material comprising a three-dimensional crystal structure represented by the formula $AMX_3$, in which A represents one or more cations which are the same or different, at least one comprising an organic cation, M represents one or a mixture of more than one divalent metal, and X are halide anions which are the same or different, the method comprising the steps of:

forming a first layer on the surface of a substrate, the first layer comprising an organic-inorganic halide perovskite material having a planar, layered two-dimensional crystal structure;

depositing on the first layer a material comprising one or more organic halides; and reacting the first layer and the mixture deposited thereon to form the polycrystalline layer comprising an organic-inorganic metal halide perovskite material having the formula $AMX_3$ as defined previously.

In other words, in the method of claim 1, step (ii) comprises a) depositing on the first layer a material comprising one or more organic halides; and b) reacting the first layer and the material deposited thereon to form the crystalline or polycrystalline layer comprising an organic-inorganic metal halide perovskite material having the formula $AMX_3$.

Figure 2B:
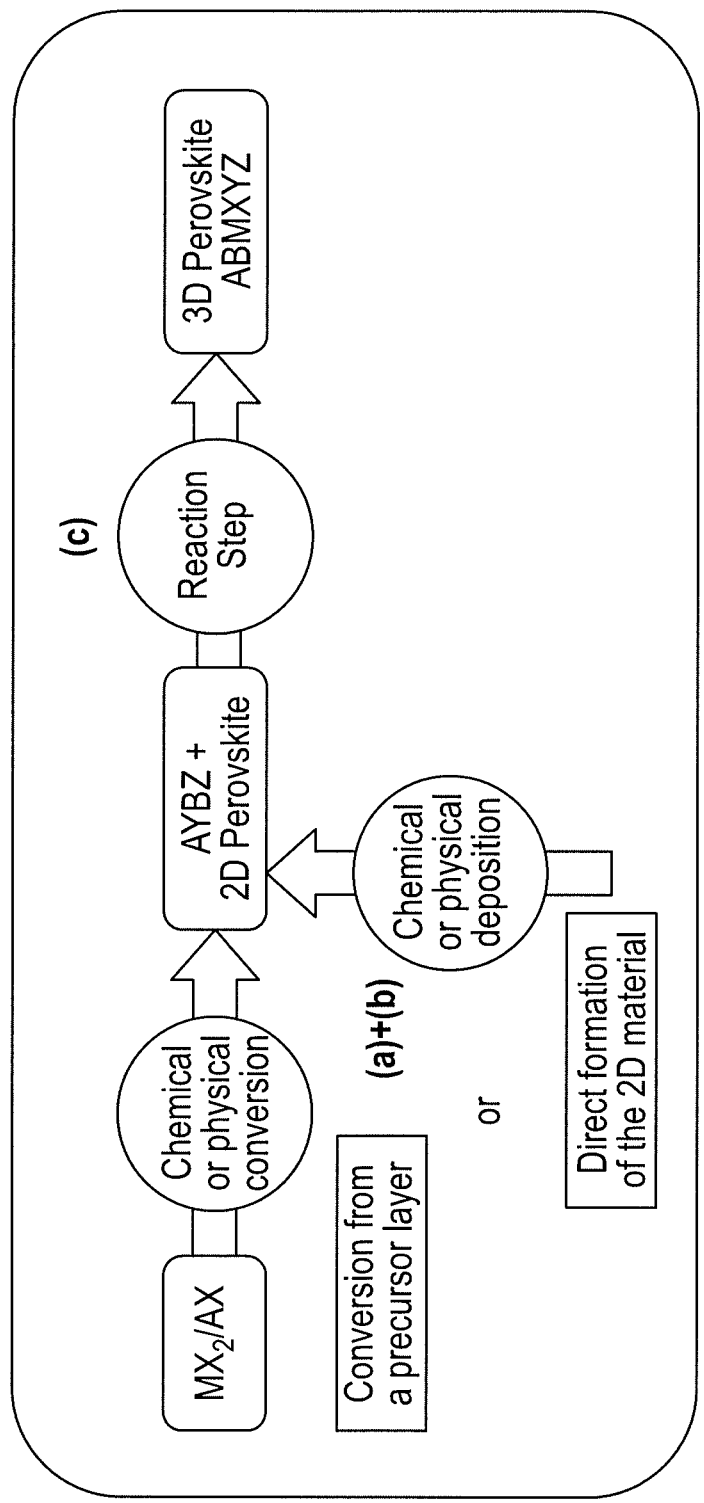
FIG. 2B illustrates a schematic representation of an alternative process flow of the present invention.

In other embodiments, there is not a separate step of depositing on the first layer a material comprising one or more organic halides. The organic halides may already be present while step (i) is being carried out and therefore the organic halides need not be added separately. This is illustrated in FIG. 2B.

In step i), the two-dimensional crystal structure typically has general formula $L_2MX_4$, in which L is a ligand which does not appear in the final perovskite product. Preferably L is an organic or inorganic cation or a mixture of organic or inorganic cations which may be the same or different. M is a divalent metal cation or a mixture of two or more different divalent metal cations. X is one or more different halide anions.

Preferably, the 2D material has the formula $L_2L'_{n-1}M_nX_{3n+1}$ or $L_2K_{n-1}M_nX_{3n+3}$ or $LL'_{n-1}M_nX_{3n+1}$ or $L_2L'_nM_nX_{3n+2}$, in which L and L' represent organic or inorganic cations which can be the same or different, K represents an organic cation different from L, M represents one or more divalent metals, and X represents one or more different halide anions.

Ideally, the 3D organic-inorganic hybrid halide perovskite is essentially free of 2D perovskite material. By this, we mean that the 3D organic-inorganic hybrid halide perovskite product layer typically comprises less than 5 wt %, preferably less than 2 wt %, even more preferably less than 1 wt % 2d perovskite material.

The step (i) of forming a first layer on a substrate of a two-dimensional organic-inorganic hybrid halide perovskite as described above may be achieved using any convenient method. Suitable methods include, but are not limited to: i) physical or chemical vapour deposition, ii) deposition from solution (this may optionally include spin coating or dipping techniques), and iii) deposition of a precursor compound, for example one or more metal halides, by physical vapour deposition or from solution, followed by conversion of this precursor compound to the desired $L_2MX_4$ material.

This first step in the reaction process may be represented by general reaction scheme:

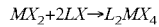

In a first method according to the present invention the first layer is formed by physical or chemical vapour deposition of the 2D-perovskite material.

In an alternative method of the present invention the first layer is formed by deposition of the 2D-perovskite material from a solution.

In a further alternative method according to the present invention the first layer is formed by physical vapour deposition of a precursor layer comprising at least one metal halide precursor material, followed by conversion of the precursor layer into the first layer comprising 2D-perovskite material.

In a variation of the above further alternative method the first layer is formed by deposition from solution of a precursor layer comprising at least one metal halide precursor material, followed by conversion of the precursor layer into the first layer comprising the 2D-perovskite material.

Figure 4:
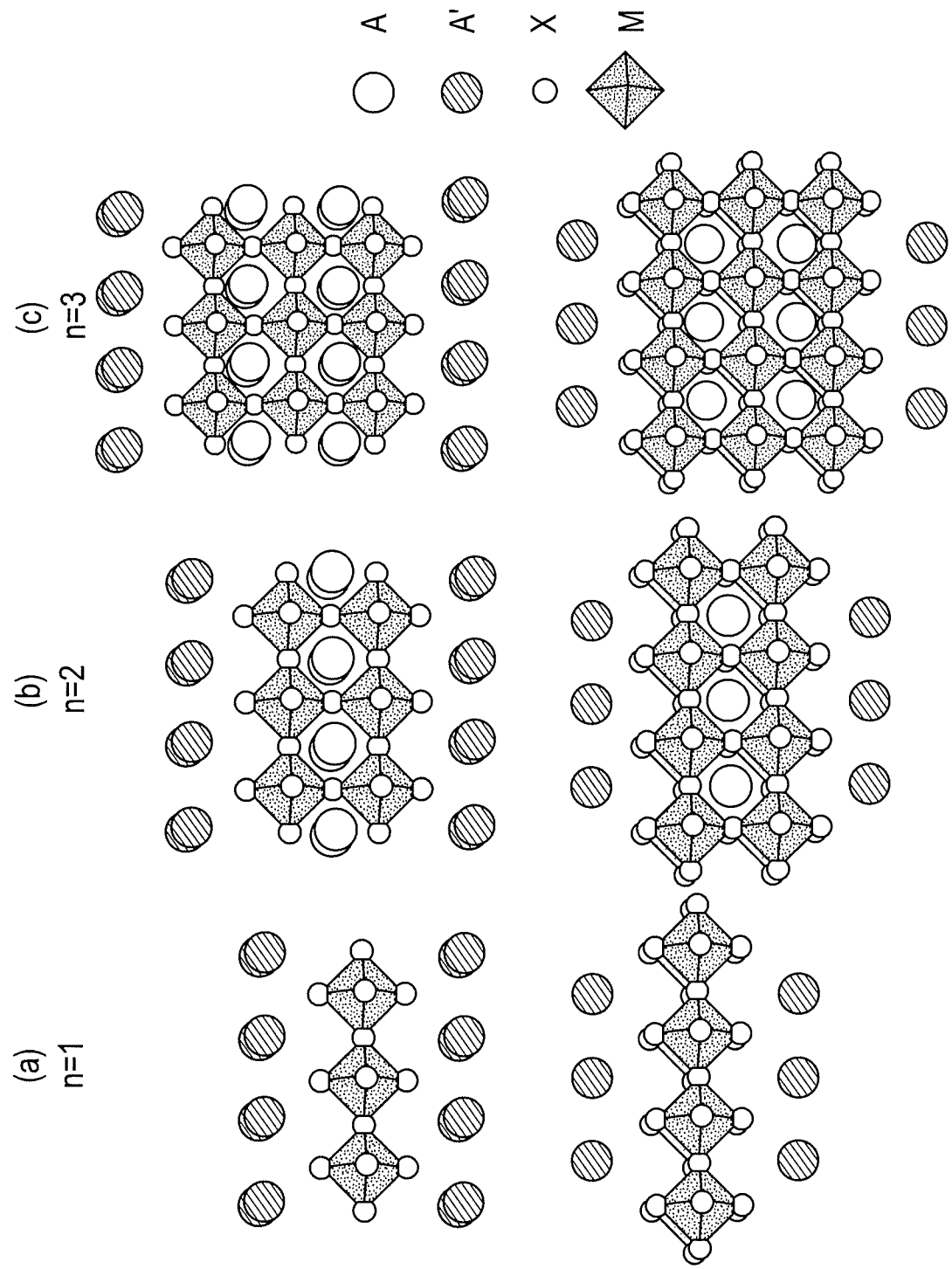
FIG. 4a-c illustrates the n=1, n=2 and n=3 members of the Ruddelsden-Popper 2D perovskite family and {110} parallel type 2D perovskites.
Figure 5:
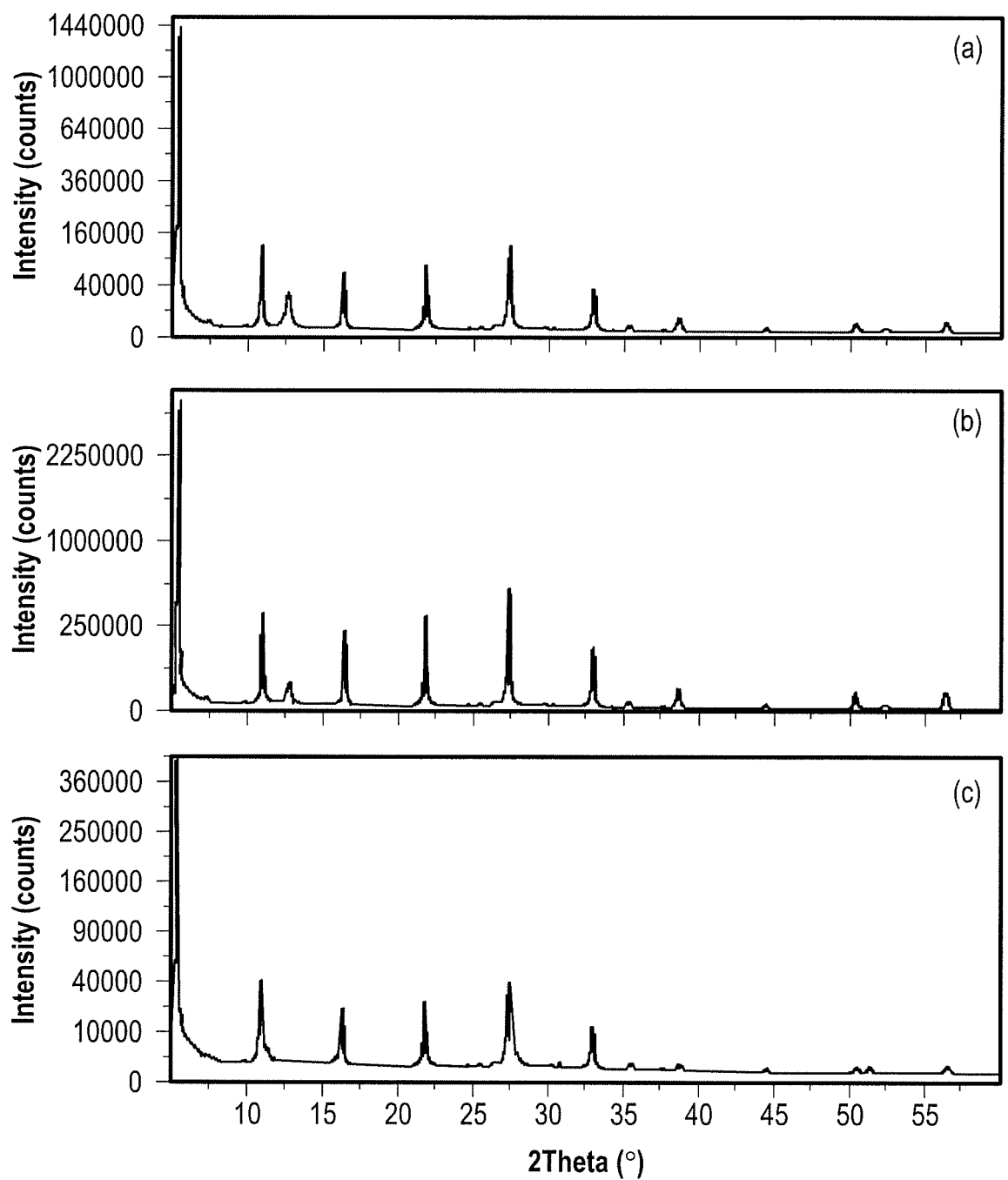
FIG. 5 shows XRD patterns of the same 2D perovskite material prepared by different routes; (a) conversion by spin coating of a solution containing the A' cation on a metal halide precursor layer, (b) conversion by chemical bath in a solution containing the A' cation of a metal halide precursor layer and (c) 1-step formation of the 2D material by spin coating of a solution containing the metal halide and the A' cation.
Figure 6A:
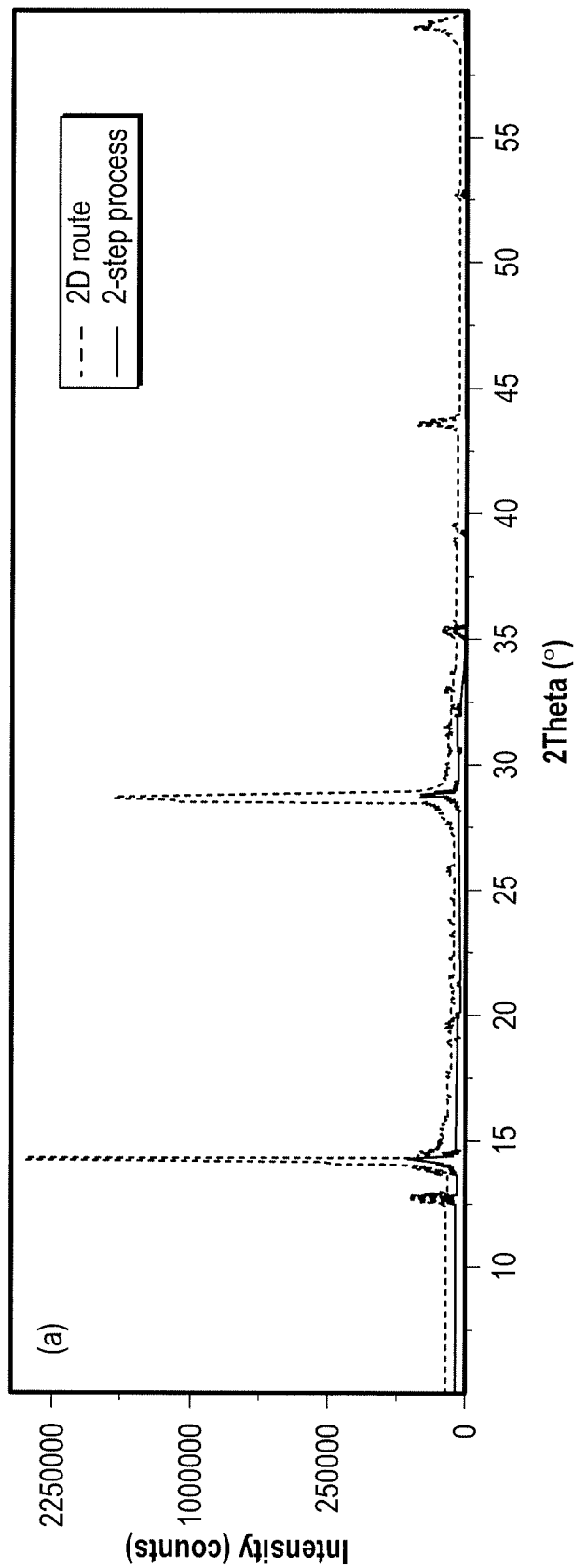
FIG. 6a shows overlapping XRD patterns for a 3D perovskite material i) made using the process of the present invention, and ii) made using a two-step prior art process.
Figure 6B:
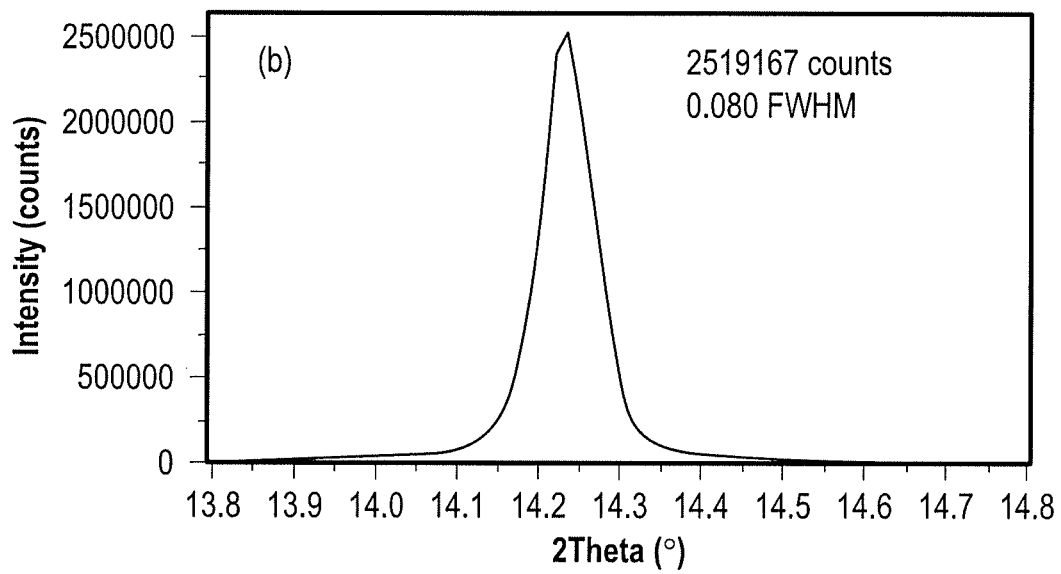
FIG. 6b shows the full width at half maximum (FWHM) value and number of counts for the 3D perovskite material made by the process of the present invention.
Figure 6C:
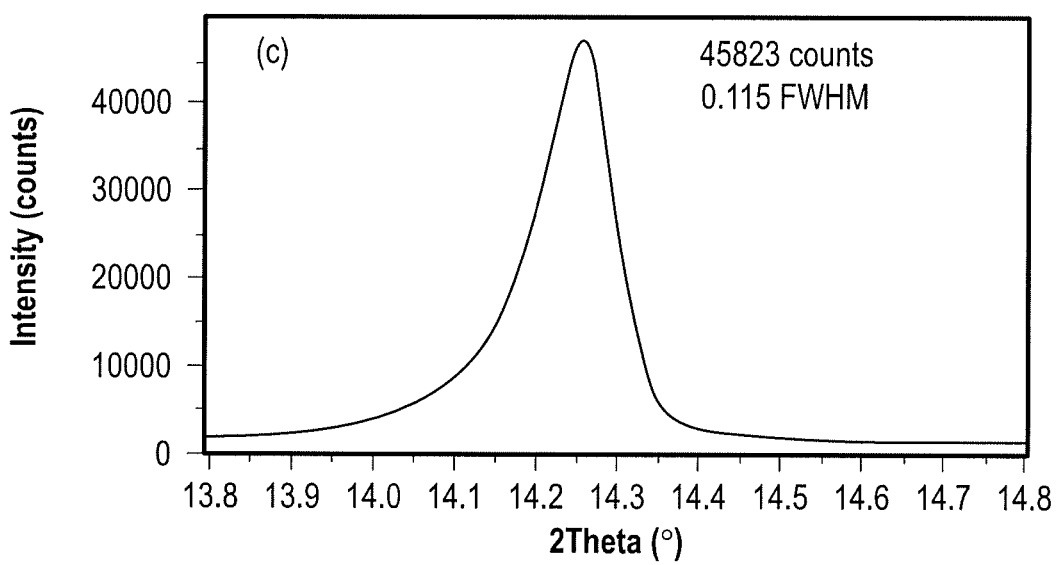
FIG. 6c shows the full width at half maximum (FWHM) value and number of counts for the 3D perovskite material made by a two-step prior art process.
Figure 7:
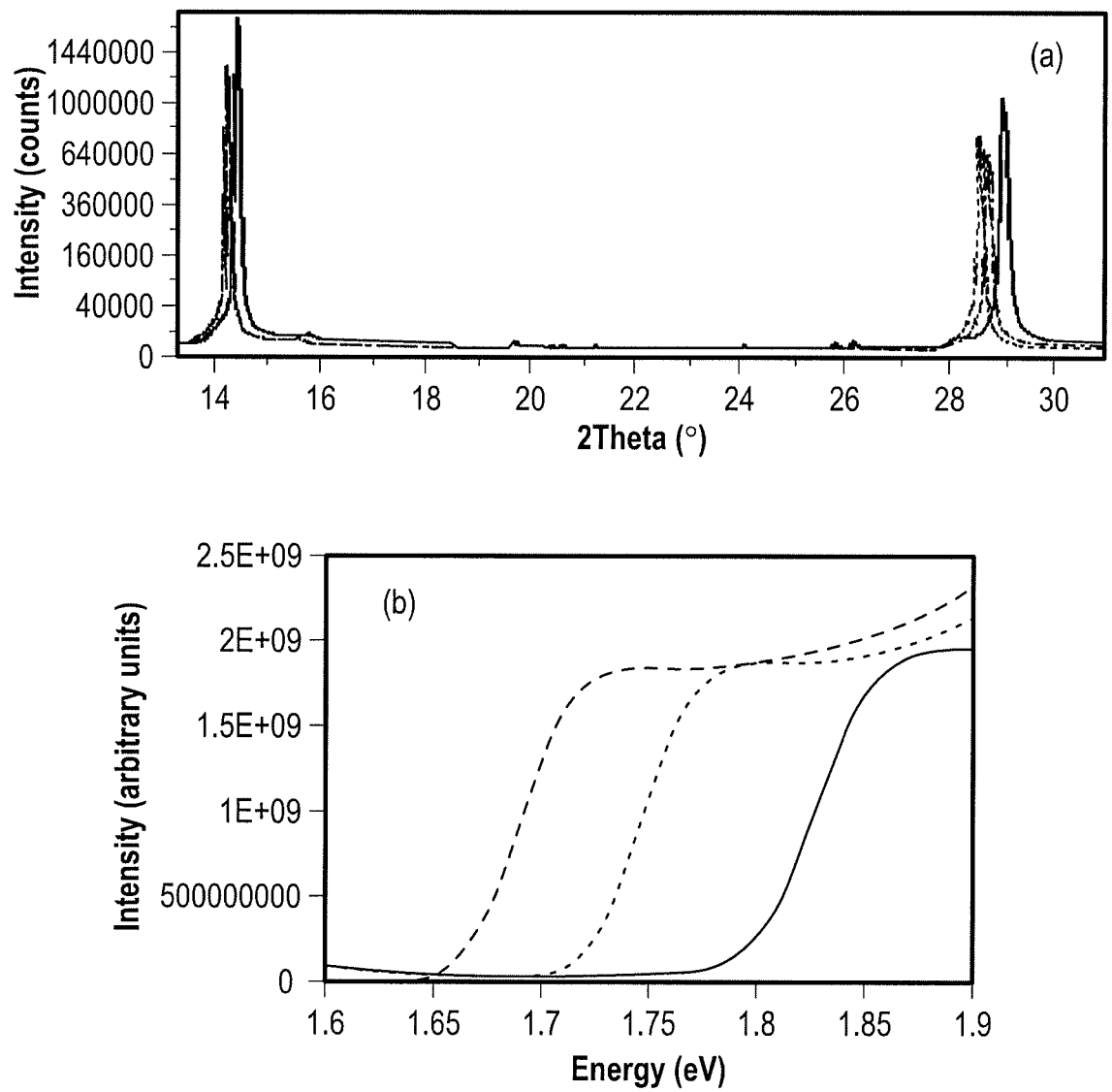
FIG. 7a shows the XRD patterns for 3 3D-perovskite films made using the process according to the present invention, with 3 different ratios of halide anion Y:Z.
FIG. 7b shows the UV-Vis spectra for the same 3 films.
Figure 8:
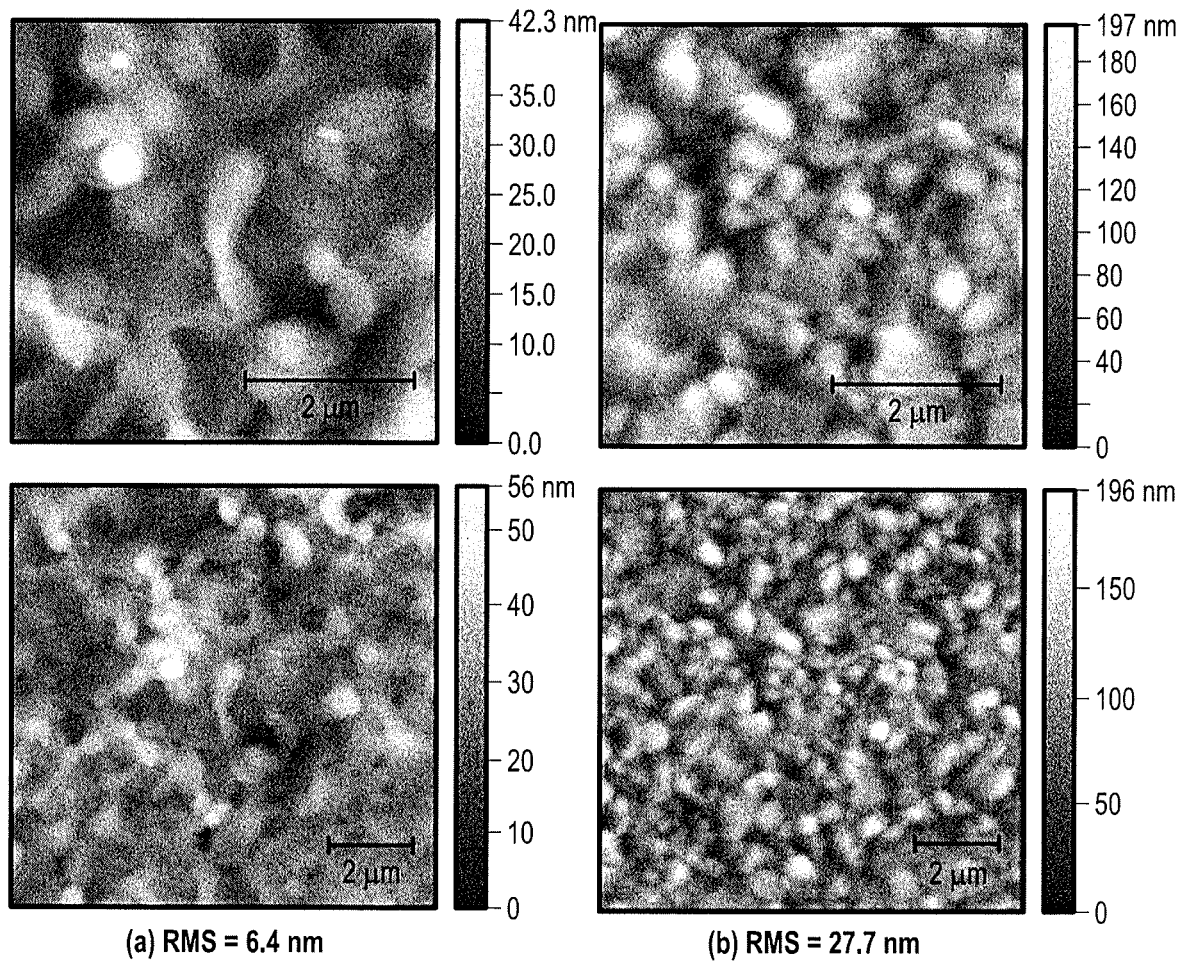
FIG. 8a shows two Atomic Force Microscope (AFM) images of a 3D-perovskite material made using the process according to the present invention.
FIG. 8b shows two Atomic Force Microscope (AFM) images of a 3D-perovskite material made using a two-step prior art process.
Figure 9:
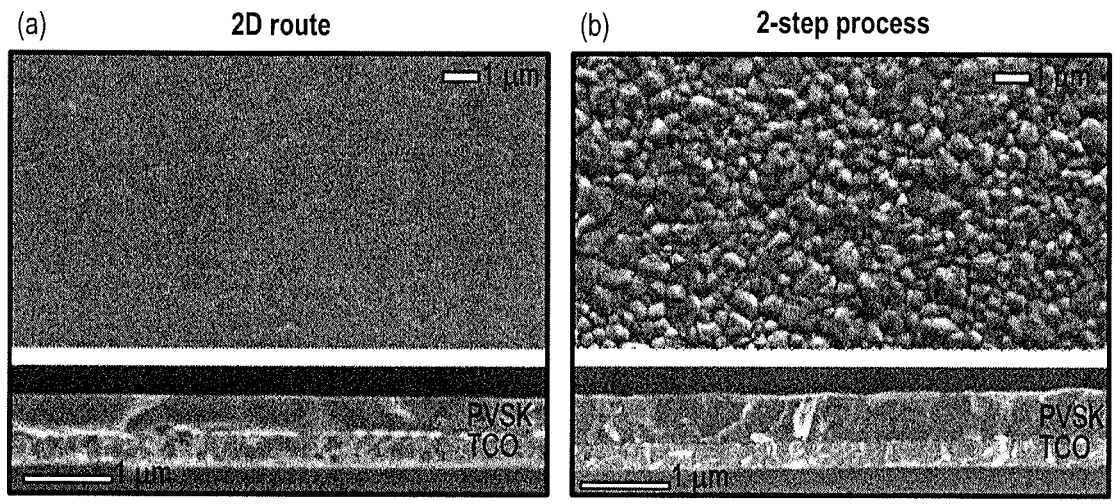
FIG. 9a shows the top plan view (upper plot) and the cross-sectional view (lower plot) produced from Scanning Electron Microscopy (SEM) images of a 3D perovskite material produced using the process according to the present invention.
FIG. 9b shows the top plan view (upper plot) and the cross-sectional view (lower plot) produced from Scanning Electron Microscopy (SEM) images of a 3D perovskite material produced using a 2-step prior art process.
Figure 10:
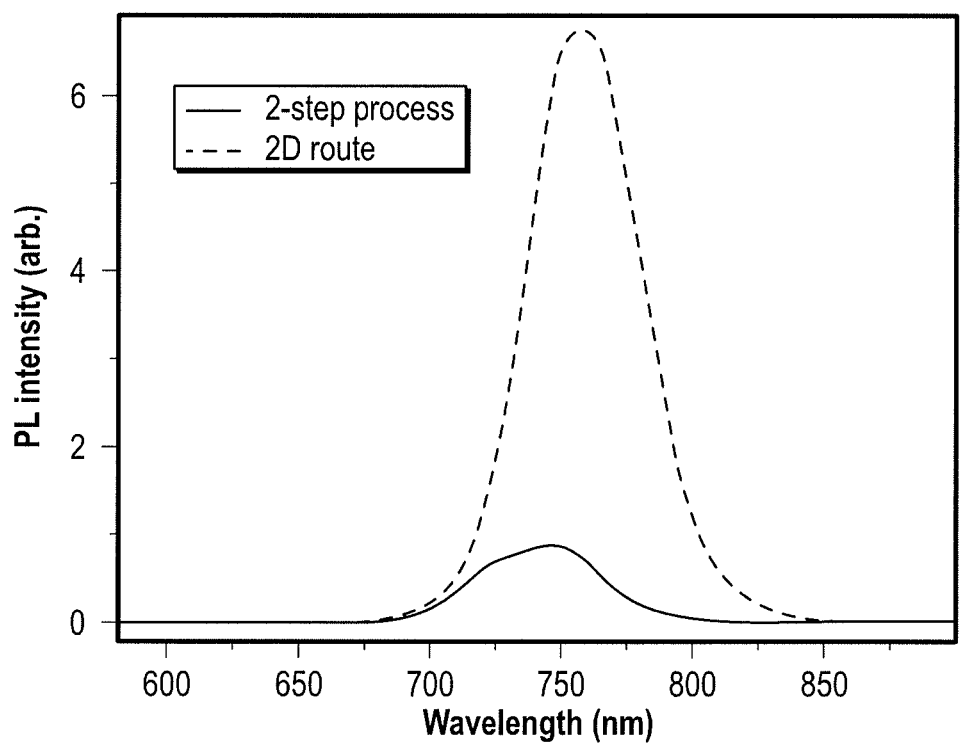
FIG. 10 shows overlapping Photoluminescence measurements for a 3D perovskite i) made using the process of the present invention (grey), and ii) made using a two-step prior art process (black)
Figure 11:
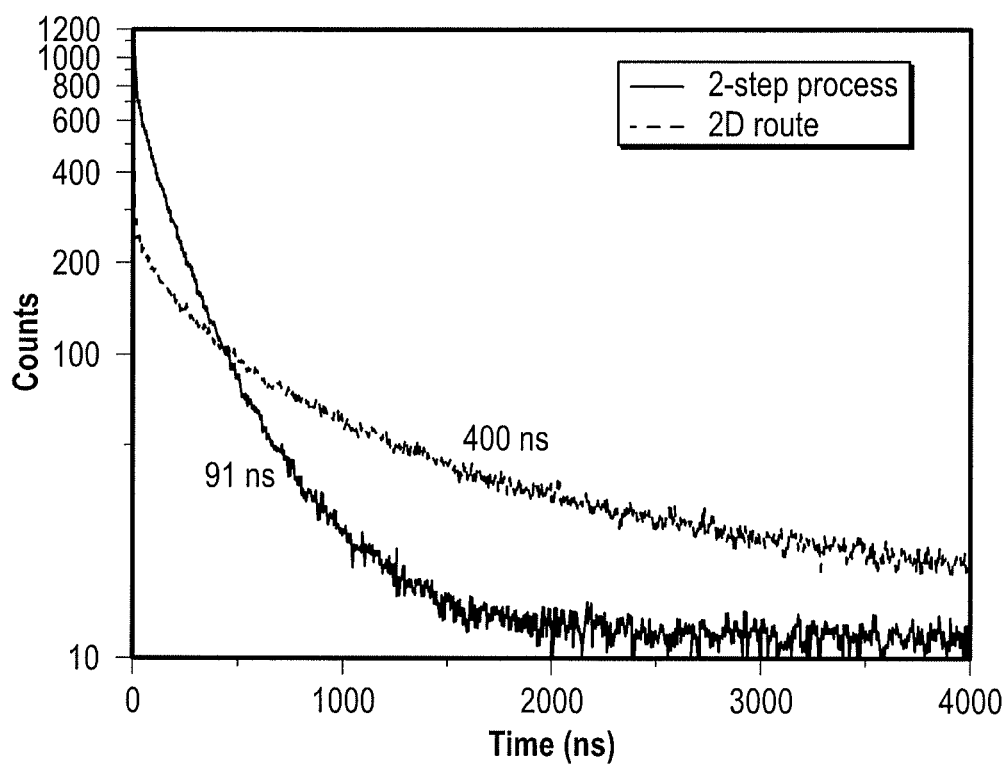
FIG. 11 shows overlapping Time-Resolved Photoluminescence (TRPL) measurements showing the charge carrier lifetime for a 3D perovskite material made using the process of the present invention compared against a 3D perovskite material made using a 2-step prior art process.
Figure 12A:
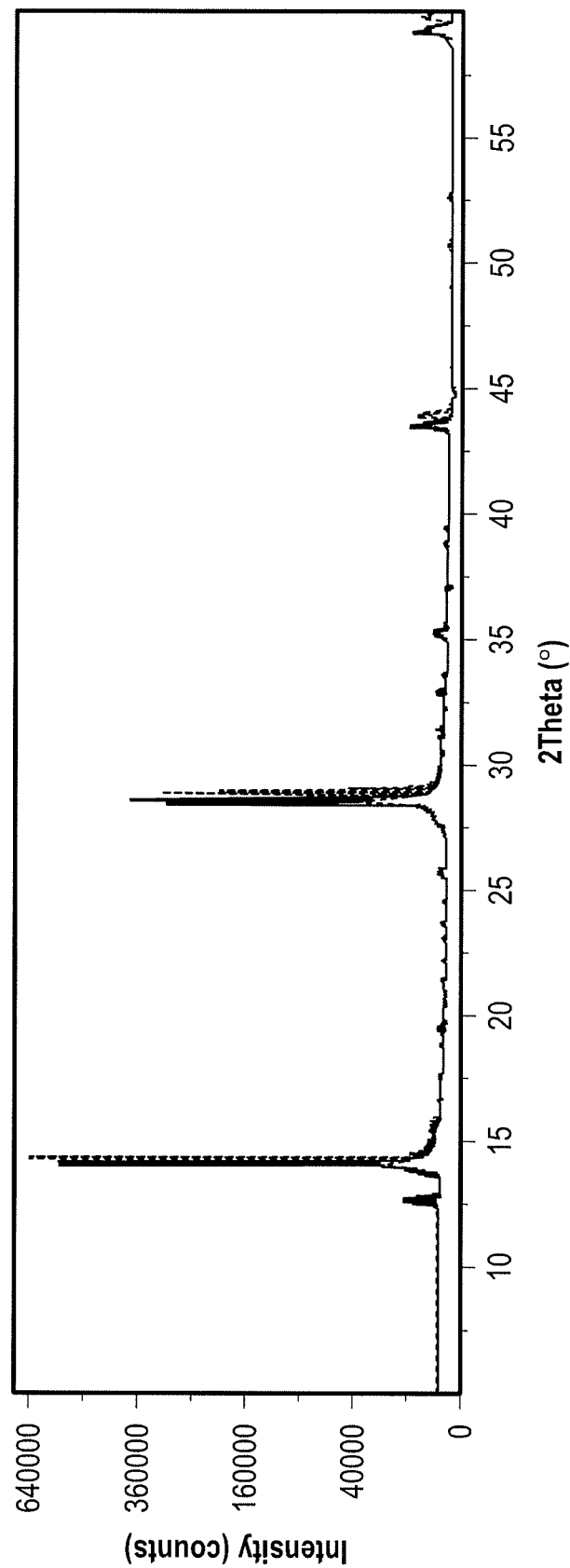
FIG. 12A shows overlapping X-ray diffraction patterns for 3D perovskite materials obtained using the process of the present invention involving direct chemical deposition of 2D materials with A'=an aryl ammonium ion (grey) or A'=an alkyl ammonium ion (black)
Figure 12B:
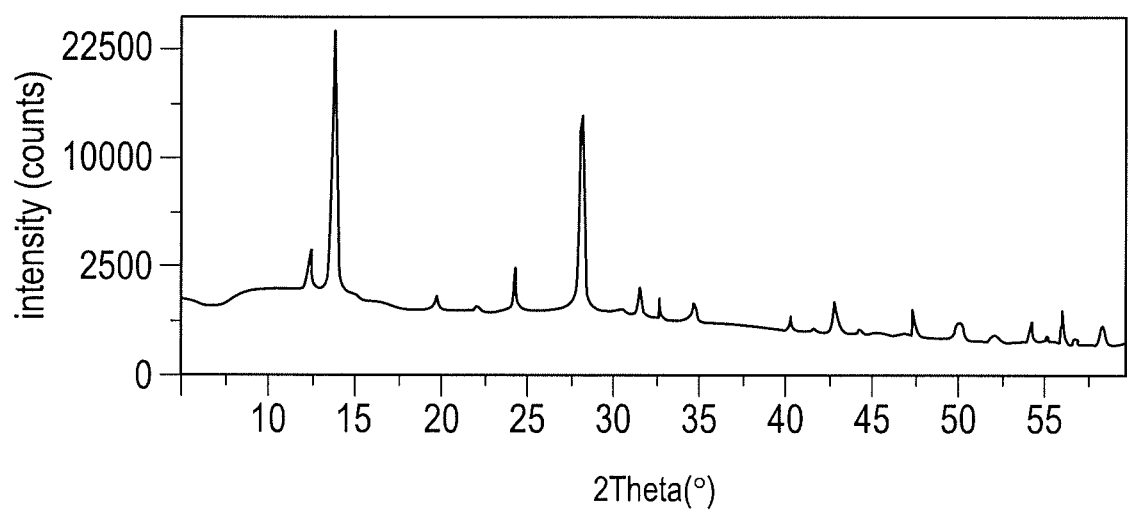
FIG. 12B shows an XRD of a perovskite, made following the method of the present invention in which there is not a second halide deposition step.

The first layer of two-dimensional organic-inorganic hybrid halide perovskite may comprise a plurality of 2D perovskite layers in any structural form. Preferably the structural form will be of a type discussed in the introduction, for example "Ruddelsden-Popper perovskites" which preferably adopt the general formula $A_{n-1}A_2'M_nX_{3n+1}$; "{110} parallel perovskites" which preferably adopt the general formula $A'_2A_nM_nX_{3n+2}$; "Aurivillius perovskites" which preferably adopt the general formula $A'_2A_{n-1}M_nX_{3n+3}$ and "Dion-Jacobson perovskites" which preferably adopt the general formula $CA_{n-1}M_nX_{3n+1}$. An example of each of these families for n=2 is shown in FIG. 4.

It is especially preferred that the first layer of two-dimensional organic-inorganic hybrid halide perovskite, comprises a plurality of 2D perovskite layers which adopt at least one of: a Ruddelsden-Popper structural form, a structural form similar to or derived from a Ruddlesden-Popper form, and a structural form which produces 2D perovskites which behave in the same, or a substantially similar, manner to those in a Ruddelsen-Popper or similar structural form.

In particular embodiments, A and L' represent the same cation which is present in the final 3D layer, and are selected from: Cs, Rb, Methylammonium, Ethylammonium, Formamidinium or Guanidinium.

L is a cation in the initial 2D precursor layer but not the final 3D layer, and is selected from: Cs, Rb, Formamidinium, Guanidinium, or organic ions $R_3NH^+$ where R are selected from H, unsubstituted or substituted aryl groups or unsubstituted or substituted alkyl groups, for example methylammonium or ethylammonium. Specific examples include:—phenethylammonium, n-propylammonium, n-butylammonium, n-pentylammonium, n-hexylammonium, n-heptylammonium, n-octylammonium, napthylethylammonium, 2-(2-naphthyl)ethananammonium, benzylammonium, phenylammonium, 2-thiopheneethylammonium, t-butylammonium, diethylammonium iso-butylammonium, cyclohexylammonium, cyclohexylmethylammonium, ethylammonium, 1,4-butanediammonium, 2,2'-Dithiobis(ethylammonium), 3-(ammoniomethyl)piperidine, 4-(ammoniomethyl)piperidine, 2-(4-Biphenyl)ethylammonium, 1,4-butanediammonium, 1,5-pentanediammonium, 1,6-hexanediammonium, 1,7-heptyldiammonium, 1,8-octodiammonium, 1,9-nonadiammonium, 1,4-benezene diammonium, and 4-Methoxy-phenethylammonium. K is another cation in the initial 2D layer but not the final 3D layer, and has the formula $H^+R_2NR'NR_2H^+$ where R is selected from H, unsubstituted or substituted aryl groups or unsubstituted or substituted alkyl groups, and R' can be unsubstituted or substituted aryl groups or unsubstituted or substituted alkyl groups.

In step ii) of the process according to one aspect of the invention, when a material comprising one or more halides is deposited on the first layer, the first layer may be exposed to a vapour comprising the organic halides AY and AZ, wherein Y and Z are halide anions which are the same or different, and cations A are the same of different and are selected from the group consisting of cations of the following metals: Cs, Rb, Formamidinium, Guanidinium, or organic ions $R_3NH^+$ where R are selected from H, unsubstituted or substituted aryl groups or unsubstituted or substituted alkyl groups, or $H^+R_2NR'NR_2H^+$ where R can be H, unsubstituted or substituted aryl groups or unsubstituted or substituted alkyl groups and R' can be unsubstituted or substituted aryl groups or unsubstituted or substituted alkyl groups. The Y and Z halide anions become the anions represented by group X in the final 3D perovskite product.

Preferred groups for the A groups in the halides AY and AZ correspond to those listed above in the final $AMX_3$ perovskite product.

Step ii) of the reaction according to this invention can be represented by general reaction scheme:

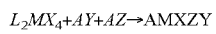

Step ii) of the reaction according to this invention is generally performed by heating to a temperature of less than 200 degrees, preferably by heating to a temperature between 100 and 180 degrees centigrade.

EXAMPLES

An overview of the reaction scheme of the process of the present invention is given in FIG. 2.

Example 1 (a)—Formation of [FA]Pbl$_2$Br (a). A layer of Pbl$_2$ 300 nm thick is evaporated onto a glass substrate. A solution of phenethylammonium iodide (PEAI) dissolved in 1-methoxy-2-propanol (PGME) with 10 percent PEAI by weight in the solution is made and filtered through a 0.2 μm filter. This solution is then spin coated onto the layer of Pbl$_2$, typically at a spin speed of 7000 rpm in an air ambient. The substrate is then transferred to an oven and baked at 90° C. for 30 minutes. This forms the first layer comprising an organic-inorganic halide perovskite material having a planar, layered two-dimensional crystal structure in which the planar layers are oriented perpendicular to the normal of the surface of the substrate and having the formula (PEA)$_2$Pbl$_4$. This layer will be approximately 400 nm thick.

(b). A solution of Formamidinium iodide (FAI) and Formamidinium bromide (FABr) dissolved in anhydrous iso-propyl alcohol (IPA), with 5 percent by weight of solids in the solution, and a 0.7:1 molar ratio of FAI:FABr is made up. The solution is filtered through a 0.2 μm filter, and spin coated onto the first layer prepared in step (a) above at a spin speed of 5000 rpm in a dry nitrogen ambient. The substrate is then transferred to a hotplate and baked at 50° C. for 1 minute, then transferred to an oven and baked at 160° C. for 60 minutes. This forms a layer of material having a three-dimensional perovskite structure having the formula [FA]Pbl$_2$Br. This layer will be approximately 400 nm thick.

Example 1 (b)—Formation of [FA]Pbl$_2$Br

The method is as described above, but the initial layer of Pbl$_2$ is deposited from solution.

Example 2—Formation of $[FA]_{(1-x)}Cs_{(x)}Pbl_2Br$ (a). A layer comprising a mixture of Pbl$_2$ and Csl 300 nm thick is deposited by co-evaporation onto a glass substrate. The mixture is controlled to have a desired molar ratio of Cs:Pb depending on the target composition of the final 3D perovskite. A solution of phenethylammonium iodide (PEAI) dissolved in 1-methoxy-2-propanol (PGME) with 10 percent PEAI by weight in the solution is made, and filtered through a 0.2 μm filter. This solution is then spin coated onto the layer of Pbl$_2$+Csl, typically at a spin speed of 7000 rpm in an air ambient. The substrate is then transferred to an oven and baked at 90° C. for 30 minutes. This forms the first layer comprising an organic-inorganic halide perovskite material having a planar, layered two-dimensional crystal structure in which the planar layers are oriented perpendicular to the normal of the surface of the substrate and having the formula $((PEA)_{1-x}Cs_{(x)})Pbl_4$. This layer will be approximately 400 nm thick.

(b). A solution of Formamidinium iodide (FAI) and Formamidinium bromide (FABr) dissolved in anhydrous iso-propyl alcohol (IPA), with 5 percent by weight of solids in the solution, and a 0.7:1 molar ratio of FAI:FABr is made up. The solution is filtered through a 0.2 μm filter, and spin coated onto the first layer prepared in step (a) above at a spin speed of 5000 rpm in a dry nitrogen ambient. The substrate is then transferred to a hotplate and baked at 50° C. for 1 minute, then transferred to an oven and baked at 160° C. for 60 minutes. This forms a layer of material having a three dimensional perovskite structure having the formula $[FA]_{(1-x)}Cs_{(x)}PbI_2Br$. This layer will be approximately 400 nm thick.

Example 3—Formation of [MA]PbI$_2$Br (a). A layer of PbI$_2$ 300 nm thick is evaporated onto a glass substrate. A solution of phenethylammonium iodide (PEAI) dissolved in 1-methoxy-2-propanol (PGME) with 10 percent PEAI by weight in the solution is made, and filtered through a 0.2 μm filter. This solution is then spin coated onto the layer of PbI$_2$, typically at a spin speed of 7000 rpm in an air ambient. The substrate is then transferred to an oven and baked at 90° C. for 30 minutes. This forms the first layer comprising an organic-inorganic halide perovskite material having a planar, layered two-dimensional crystal structure in which the planar layers are oriented perpendicular to the normal of the surface of the substrate and having the formula (PEA)$_2$PbI$_4$. This layer will be approximately 400 nm thick.

(b). A solution of methylammonium iodide (MAI) and methylammonium bromide (MABr) dissolved in anhydrous isopropyl alcohol (IPA), with 5 percent by weight of solids in the solution, and a 0.7:1 molar ratio of MAI:MABr is made up. The solution is filtered through a 0.2 μm filter, and spin coated onto the first layer prepared in step (a) above at a spin speed of 5000 rpm in a dry nitrogen ambient. The substrate is then transferred to a hotplate and baked at 50° C. for 1 minute, then transferred to an over and baked at 160° C. for 60 minutes. This forms a layer of material having a three-dimensional perovskite structure having the formula [MA]PbI$_2$Br. This layer will be approximately 400 nm thick.

Example 4

The first layer comprising an organic-inorganic halide perovskite material having a planar, layered two-dimensional crystal structure in which the planar layers are oriented perpendicular to the normal of the surface of the substrate mentioned in step (a) in examples 1 to 3 above may, in an alternative embodiment, be grown directly from the vapour phase as described, for example, in Masanao Era et al., "Self-Organised Growth of PbI-based Layered Perovskite Quantum Well by Dual-Source Vapour Deposition" Chem. Mater. Vol. 9, No. 1, pp 8-10 [1997].

Example 5

In Examples 1 to 3 above, the organic halides (FAI and FABr) may be added to the initial reaction mixture together with the PEAI Thus the organic halides are not added in a separate step, (b). Both the organic halides and the PEAI are delivered to the metal halide film, and the 2D perovskite structure forms with the FA in situ. The 3D perovskite structure is formed via heating in the same manner as described for the Examples above.

Example 6

18 functioning devices were constructed and tested as described below. The devices were divided into two groups: the first having the perovskite layer produced according to the 2-D process of the present invention as described above in Example 2, and the second having the perovskite layer produced according to the two-step process of the prior art.

The devices were n-i-p single junctions built on a glass substrate and contacted with gold electrodes, with the same device structure used in both groups, with only perovskite deposition altered. Current-voltage (JV) characteristics of the solar cells were recorded in ambient air under simulated AM 1.5 solar light (1-Sun, 100 mW cm$^{-2}$) generated by an ABET Class AAB sun 2000 simulator. The solar simulator was calibrated for a 1.6 eV perovskite bandgap using a certified KG3 filtered silicon reference cell. Each device was measured with a 20 mV voltage step using a Keithley 2400 source meter. All devices were masked with a 0.0919 cm$^2$ metal aperture to define the active area and eliminate edge effects.

The average efficiencies over 18 functioning devices per split were 14.84 for the 2-step process and 15.93 for the 2D process of the invention.

Extracted parameters and comparative data are shown in the table below, wherein the figures are derived from the plots in FIG. 13:

|  | 2D Route | 2 step process |
|---|---|---|
| η (%) | 17.3 | 16.7 |
| $V_{oc}$ (V) | 1.13 | 1.10 |
| FF (%) | 78.8 | 79.3 |
| $J_{sc}$ (mA·cm$^{-2}$) | 19.43 | 19.19 |

Figure 13:
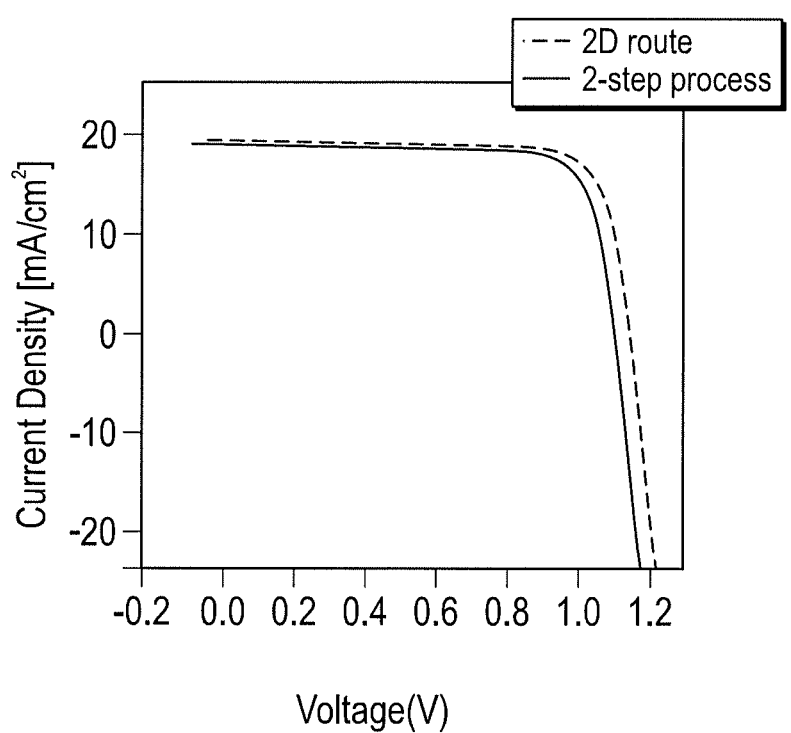
FIG. 13 illustrates a plot of the current-voltage sweep for single-junction devices prepared by the 2D route and 2-step process, where we see a Voc gain via the 2D route, as would be expected from higher PLQE.

The data is illustrated in FIG. 13 which shows a plot of the current-voltage sweep for single-junction devices prepared by the 2D route and 2-step process, where we see a Voc gain via the 2D route, as would be expected from the higher photoluminescence quantum efficiency (PLQE).

The invention claimed is:

1. A method of forming a crystalline or polycrystalline layer of an organic-inorganic metal halide perovskite material comprising a three-dimensional crystal structure represented by the formula AMX$_3$,
   in which A comprises a monovalent organic cation,
   M comprises at least one divalent inorganic cation selected from Pb$^{2+}$ and Sn$^{2+}$,
   and X comprises one or more halide anions independently selected from fluoride, chloride, bromide, and iodide,
   the method comprising the steps of:
   (i) forming a first layer on the surface of a substrate, the first layer comprising an organic-inorganic metal halide perovskite material having a planar, layered two-dimensional crystal structure, and
   (ii) reacting the first layer with one or more organic halides to form the crystalline or polycrystalline layer comprising an organic-inorganic metal halide perovskite material having the formula AMX$_3$.

2. The method of claim 1, wherein step (ii) comprises:
   a) depositing on the first layer a material comprising one or more organic halides; and
   b) reacting the first layer and the material deposited thereon to form the crystalline or polycrystalline layer comprising an organic-inorganic metal halide perovskite material having the formula AMX$_3$.

3. The method according to claim 1, wherein in step i) the first layer comprises a material having a formula selected from $L_2L'_{n-1}M_nX3_{n+1}$ or $L_2K_{n-1}M_nX_{3n+3}$, $LL'_{n-1}M_nX3_{n+1}$ or $L_2L'_nM_nX_{3n+2}$, in which L and L' represent organic or inorganic cations which can be the same or different, K represents an organic cation and is different from L, M represents a divalent metal cation or two or more different divalent metal cations selected from $Pb^{2+}$ and $Sn^{2+}$, and X represents halide anions independently selected from fluoride, chloride, bromide, and iodide.

4. The method as claimed in claim 3, wherein L, L' and K are independently selected from the group consisting of: napthylethylammonium, n-propylammonium, benzylammonium, phenylammonium, n-pentylammonium, 2-thiopheneethylammonium, t-butylammonium, diethylammonium, iso-butylammonium, cyclohexylammonium, cyclohexylmethylammonium, and ethylammonium.

5. The method as claimed in claim 1, wherein the first layer is formed by physical or chemical vapour deposition of the organic-inorganic metal halide perovskite material having a planar, layered two-dimensional crystal structure.

6. The method as claimed in claim 1, wherein the first layer is formed by deposition of the organic-inorganic metal halide perovskite material from a solution.

7. The method as claimed in claim 1, wherein the first layer is formed by depositing a precursor material on the surface of the substrate comprising one or more metal halide materials, followed by converting the metal halide precursor material into the first layer comprising said organic-inorganic metal halide perovskite material having a planar, layered two-dimensional crystal structure.

8. The method as claimed in claim 7, wherein the metal halide precursor material is converted into the first layer by depositing one or more organic halide materials onto the metal halide precursor material and reacting the organic halide and metal halide materials to form the first layer comprising said organic-inorganic metal halide perovskite material having a planar, layered two-dimensional crystal structure.

9. The method as claimed in claim 8, wherein the one or more organic halide materials are selected from the group consisting of: napthylethylammonium iodide, n-propylammonium iodide, benzylammonium iodide, phenylammonium iodide, n-pentylammonium iodide, 2-thiopheneethylammonium iodide, t-butylammonium iodide, diethylammonium iodide, iso-butylammonium iodide, cyclohexylammonium iodide, cyclohexylmethylammonium iodide, and ethylammonium iodide.

10. The method as claimed in claim 1, wherein the first layer is formed by depositing a precursor material on the surface of the substrate comprising one or more organic halide materials, followed by depositing one or more metal halide materials, and subsequently converting the organic halide and metal halide materials into the first layer comprising said organic-inorganic metal halide perovskite material having a planar, layered two-dimensional crystal structure.

11. The method as claimed in claim 7, wherein the precursor materials are deposited from a solution.

12. The method as claimed in claim 8, wherein the one or more organic halide materials are deposited from a solution of one or more organic ammonium halides dissolved in a solvent onto the one or more metal halide materials followed by removal of the solvent.

13. The method as claimed in claim 12, wherein the solvent comprises one or more solvents selected from the group consisting of 1-butanol, 1-propanol, isopropyl alcohol, 1-methoxy-2-propanol, 2-methoxy-methanol, 2-ethoxy-ethanol, ethylene glycol mono-tert-butyl ether, and toluene.

14. The method as claimed in claim 12, wherein the organic ammonium halide is selected from the group consisting of: napthylethylammonium iodide, n-propylammonium iodide, benzylammonium iodide, phenylammonium iodide, n-pentylammonium iodide, 2-thiopheneethylammonium iodide, t-butylammonium iodide, diethylammonium iodide, iso-butylammonium iodide, cyclohexylammonium iodide, cyclohexylmethylammonium iodide, and ethylammonium iodide.

15. The method as claimed in claim 2, wherein:
the material in step a) is deposited by exposing the first layer to a vapour comprising the halides AY and AZ,
wherein Y and Z are halide anions which are the same or different, and
the cations A are the same or different and each comprise an organic monocation selected from the group consisting of:
Formamidinium, Guanidinium,
$R_3NH^+$ where R are selected from the group consisting of H, unsubstituted or substituted aryl groups, and unsubstituted or substituted alkyl groups, and
$H^+R_2NR'NR_2H^+$ where R is selected from the group consisting of H, unsubstituted or substituted aryl groups, and unsubstituted or substituted alkyl groups, and R' is selected from the group consisting of unsubstituted or substituted aryl groups, and unsubstituted or substituted alkyl groups,
and optionally wherein the cations A further comprise a monovalent inorganic cation selected from Cs and Rb.

16. The method as claimed in claim 2, wherein:
the material in step a) is deposited from a solution of the halides AY and AZ,
wherein Y and Z are halide anions which are the same or different, and
the cations A are the same or different and each comprise an organic monocation selected from the group consisting of:
Formamidinium, Guanidinium,
$R_3NH^+$ where R are selected from the group consisting of H, unsubstituted or substituted aryl groups, and unsubstituted or substituted alkyl groups, and
$H^+R_2NR'NR_2H^+$ where R is selected from the group consisting of H, unsubstituted or substituted aryl groups, and unsubstituted or substituted alkyl groups, and R' is selected from the group consisting of unsubstituted or substituted aryl groups, and unsubstituted or substituted alkyl groups,
and optionally wherein the cations A further comprise a monovalent inorganic cation selected from Cs and Rb.

17. The method as claimed in claim 1, wherein the reaction in step ii) is achieved by heating the materials above room temperature.

18. The method as claimed in claim 17, wherein the heating is performed at a temperature of less than 200 degrees centigrade.

19. A method of making an optoelectronic or photovoltaic device including an active layer comprising an organic-inorganic metal halide perovskite material comprising a three-dimensional crystal structure represented by the formula $AMX_3$, in which A comprises a monovalent organic cation, M comprises at least one divalent inorganic cation selected from $Pb^{2+}$ and $Sn^{2+}$, and X comprises one or more halide anions independently selected from fluoride, chloride, bromide, and iodide, wherein the method comprises forming the material comprising the active layer by the method according to claim 1.

* * * * *